(12) United States Patent
Hollis et al.

(10) Patent No.: US 8,698,497 B2
(45) Date of Patent: Apr. 15, 2014

(54) MULTI-FIELD-OF-VIEW GRADIENT COIL

(75) Inventors: Timothy James Hollis, Abingdon (GB); Chris Cirel, Abingdon (GB)

(73) Assignee: General Electric Company, Schenectady, NY (US)

( * ) Notice: Subject to any disclaimer, the term of this patent is extended or adjusted under 35 U.S.C. 154(b) by 874 days.

(21) Appl. No.: 12/889,053

(22) Filed: Sep. 23, 2010

(65) Prior Publication Data
US 2012/0074942 A1    Mar. 29, 2012

(51) Int. Cl.
*G01V 3/00* (2006.01)

(52) U.S. Cl.
USPC ........................................................ 324/318

(58) Field of Classification Search
USPC ................................. 324/300–318
See application file for complete search history.

(56) References Cited

U.S. PATENT DOCUMENTS

| | | | |
|---|---|---|---|
| 6,525,536 B2 | 2/2003 | Minas et al. | |
| 6,630,829 B1 | 10/2003 | Liu | |
| 7,495,442 B2 * | 2/2009 | Heid | 324/318 |
| 7,570,141 B2 | 8/2009 | Hollis et al. | |
| 2003/0197507 A1 | 10/2003 | Liu | |
| 2012/0217967 A1 * | 8/2012 | Tsujita | 324/322 |

FOREIGN PATENT DOCUMENTS

| | | |
|---|---|---|
| EP | 0136536 A2 | 4/1985 |
| WO | 2005/024443 A2 | 3/2005 |

OTHER PUBLICATIONS

GB Search Report from corresponding GB Application No. 1115551.2, Jan. 3, 2012.

* cited by examiner

*Primary Examiner* — Dixomara Vargas
(74) *Attorney, Agent, or Firm* — The Small Patent Law Group; Dean D. Small

(57) ABSTRACT

A coil assembly for a Magnetic Resonance Imaging (MRI) system includes a primary gradient coil, and a corrector coil, at least a portion of the corrector coil being interwoven with a portion of the primary gradient coil such that the portion of the primary gradient coil is concentric with the portion of the corrector coil. An MRI imaging system and a method of fabricating the coil assembly are also provided.

21 Claims, 5 Drawing Sheets

MULTI-FIELD-OF-VIEW GRADIENT COIL

BACKGROUND OF THE INVENTION

The subject matter disclosed herein relates generally to gradient and more particularly to a gradient coil capable of generating multiple Fields-of-View (FOVs) in an imaging system.

Magnetic Resonance Imaging (MRI) systems typically include a superconducting magnet that generates a primary magnetic field within an imaging volume. The MRI system may also include gradient coils to generate a gradient field about a bore of the magnet. Generally, a patient is positioned on an examination table and inserted into the bore of the magnet. The magnet generates a uniform magnetic field $B_0$ throughout the bore. The gradient coils extend around the bore and are energized to impose time and spatially varying magnetic fields on the uniform magnetic field.

In, general the larger FOV lowers the performance rating for that respective gradient coil. That is a gradient coil with a larger FOV requires more power to produce a given gradient strength than a gradient coil having a smaller FOV. Because coil inductance increases with the FOV size, the slew rate, i.e. the maximum rate of change of magnetic field gradient that can be generated by a gradient coil with a large FOV is reduced for a given power supply. Additionally, since gradient coils with larger FOVs typically expose the patient to a higher rate of change of magnetic field (dB/dt) that may result in peripheral nerve stimulation, imaging protocols utilizing higher gradient power and higher slew rates are generally performed on MRI systems equipped with a small FOV gradient set. Accordingly, it is desirable to optimize the FOV for a specific imaging procedure.

To optimize the FOV for a specific imaging procedure, at least one known MRI system includes at least one gradient coil and a different higher order gradient coil that is mounted separately from the gradient coil. Typically, the higher order gradient coil is mounted radially outwardly from the primary gradient coil such that the higher order gradient coil is radially separated from the gradient coil by a distance or gap. During operation, the magnetic field of the higher order gradient coil is varied to increase or decrease the size of the FOV. However, manufacturing an imaging system that includes two separate gradient coils that are installed at two different radial locations increases the complexity of the imaging system, which may also result in increased costs to manufacture the imaging system.

BRIEF DESCRIPTION OF THE INVENTION

In one embodiment, a coil assembly for a Magnetic Resonance Imaging (MRI) system is provided. The coil assembly includes a primary gradient coil, and a corrector coil, at least a portion of the corrector coil being interwoven with a portion of the primary gradient coil such that the portion of the primary gradient coil is concentric with the portion of the corrector coil.

In another embodiment, a Magnetic Resonance Imaging (MRI) system is provided. The MRI system includes a primary gradient coil disposed around a magnet, and a corrector coil, at least a portion of the corrector coil being interwoven with a portion of the primary gradient coil such that the portion of the primary gradient coil is concentric with the portion of the corrector coil.

In a further embodiment, a method of fabricating a coil assembly for a Magnetic Resonance Imaging (MRI) system is provided. The method includes winding a primary gradient coil about a central axis, and winding a corrector coil such that at least a portion of the corrector coil is interwoven with a portion of the primary gradient coil and such that the portion of the primary gradient coil is concentric with the portion of the corrector coil around the central axis.

DETAILED DESCRIPTION OF THE INVENTION

Figure 1:
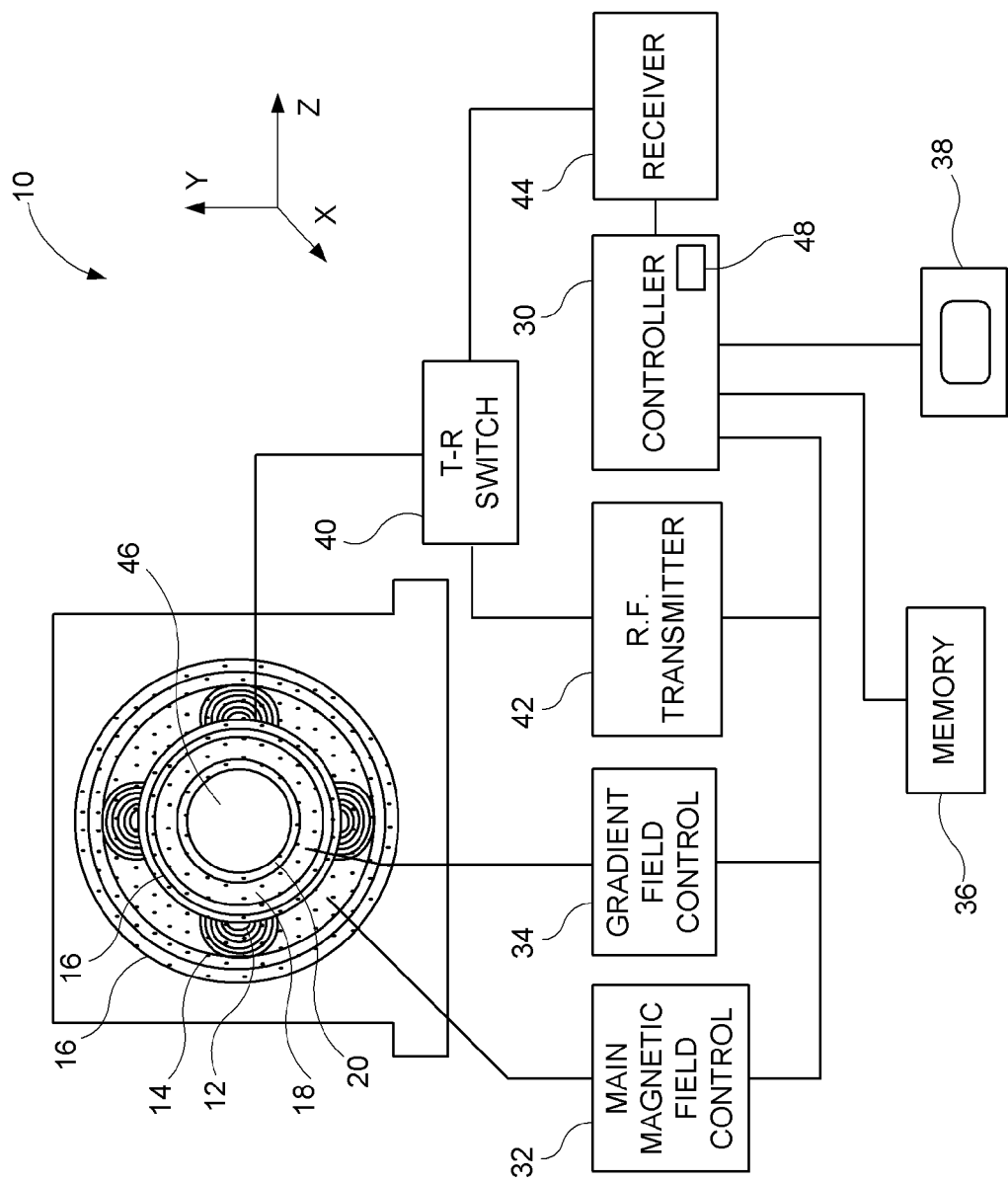
FIG. 1 is a schematic block illustration of an exemplary imaging system formed in accordance with various embodiments.

Embodiments of the invention will be better understood when read in conjunction with the appended drawings. To the extent that, the drawings illustrate diagrams of the functional blocks of various embodiments, the functional blocks are not necessarily indicative of the division between hardware circuitry. Thus, for example, one or more of the functional blocks (e.g., processors, controllers or memories) may be implemented in a single piece of hardware (e.g., a general purpose signal processor or random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments described herein provide a gradient coil capable of generating multiple fields of view in an imaging system. By practicing at least one embodiment, and at least one technical effect of various embodiments, personnel are enabled to modify the performance characteristics of the gradient coil and also to modify the FOV of the gradient coil.

Various embodiments of the gradient coil described herein may be provided as part of, or used with, a medical imaging system, such as an imaging system 10 shown in FIG. 1. It should be appreciated that although the imaging system 10 is illustrated as a single modality imaging system, the various embodiments may be implemented in or with multi-modality imaging systems. For example, the imaging system 10 is illustrated as an MRI imaging system and may be combined with different types of medical imaging systems, such as a Computed. Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

In the exemplary embodiment, the imaging system 10 includes a superconducting magnet 12. A vessel 14 (also referred to as a cryostat) surrounds the superconducting magnet 12 and is tilled with liquid helium to cool the coils of the superconducting magnet 12. A thermal insulation 16 is provided surrounding the outer surface of the vessel 14 and the inner surface of the superconducting magnet 12. The imaging system 10 also includes a plurality of magnetic gradient coils 18 and an RF transmit coil 20. The imaging system 10 also generally includes a controller 30, a main magnetic field control 32, a gradient field control 34, a memory 36, a display device 38, a transmit-receive (T-R) switch 40, an RF transmitter 42, and a receiver 44.

In operation, a body of an object, such as a patient (not shown), or a phantom to be imaged, is placed in a bore 46 on a suitable support, for example, a motorized table (not shown) or other patient table. The superconducting magnet 12 produces a uniform and static main magnetic field $B_0$ across the bore 46. The strength of the electromagnetic field in the bore 46 and correspondingly in the patient, is controlled by the controller 30 via the main magnetic field control 32, which also controls a supply of energizing current to the superconducting magnet 12.

The magnetic gradient coils 18, which include one or more gradient coil elements, are provided so that a magnetic gradient can be imposed on the magnetic field $B_0$ in the bore 46 in any one or more of three orthogonal directions x, y, and z. The magnetic gradient coils 18 are energized by the gradient field control 34 and are also controlled by the controller 30.

The RF transmit coil 20, which may include a plurality of coils (e.g., resonant surface coils), is arranged to transmit magnetic pulses and/or optionally simultaneously detect MR signals from the patient, if receive coil elements are also provided. The RF transmit coil 20 and the receive surface coil, if provided, may be selectably interconnected to one of the RF transmitter 42 or receiver 44, respectively, by the T-R switch 40. The RF transmitter 42 and T-R switch 40 are controlled by the controller 30 such that RF field pulses or signals are generated by the RF transmitter 42 and selectively applied to the patient for excitation of magnetic resonance in the patient.

Following application of the RF pulses, the T-R switch 40 is again actuated to decouple the RF transmit coil 20 from the RF transmitter 42. The detected MR signals are in turn communicated to the controller 30. The controller 30 includes a processor 48 that controls the processing of the MR signals to produce signals representative of an image of the patient. The processed signals representative of the image are also transmitted to the display device 38 to provide a visual display of the image. Specifically, the MR signals fill or form a k-space that is Fourier transformed to obtain a viewable image. The processed signals representative of the image are then transmitted to the display device 38.

Figure 2:
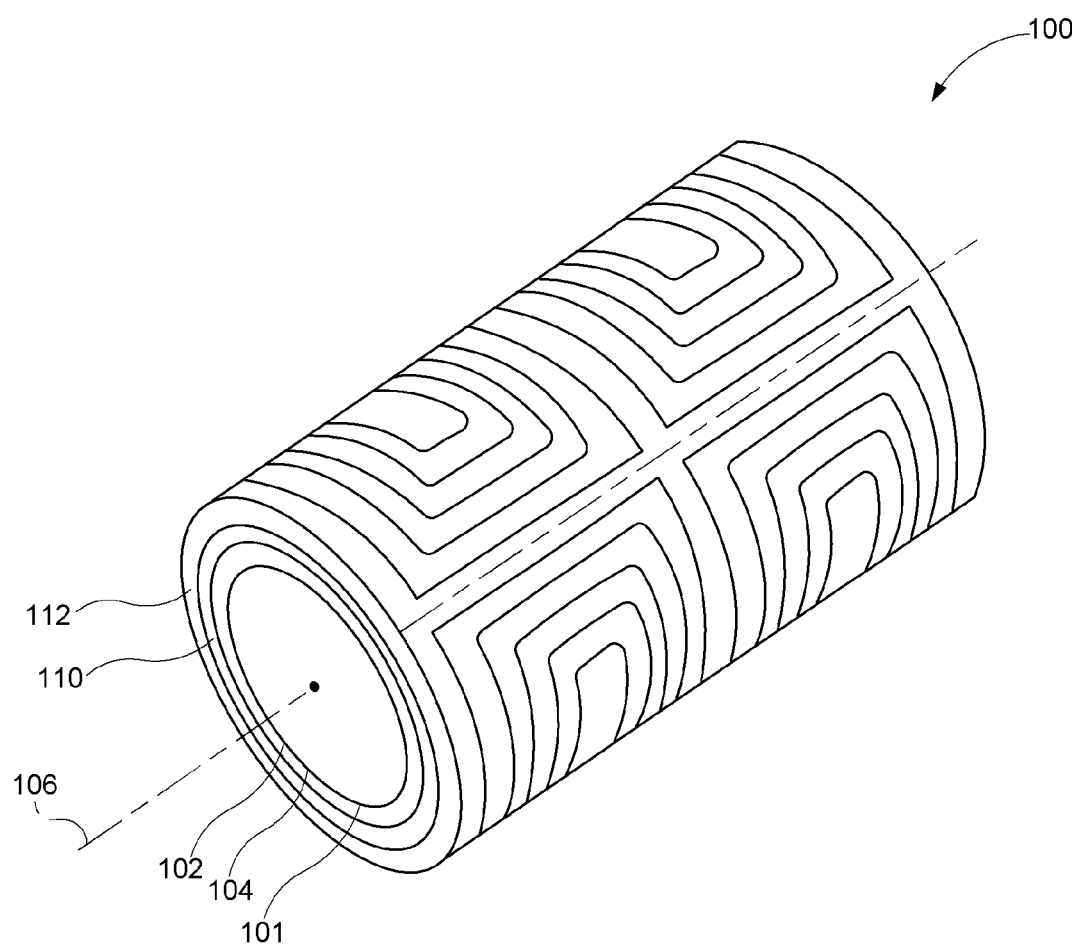
FIG. 2 is a perspective view of an exemplary coil assembly that may be used with the system shown in FIG. 1 in accordance with various embodiments.
Figure 3:
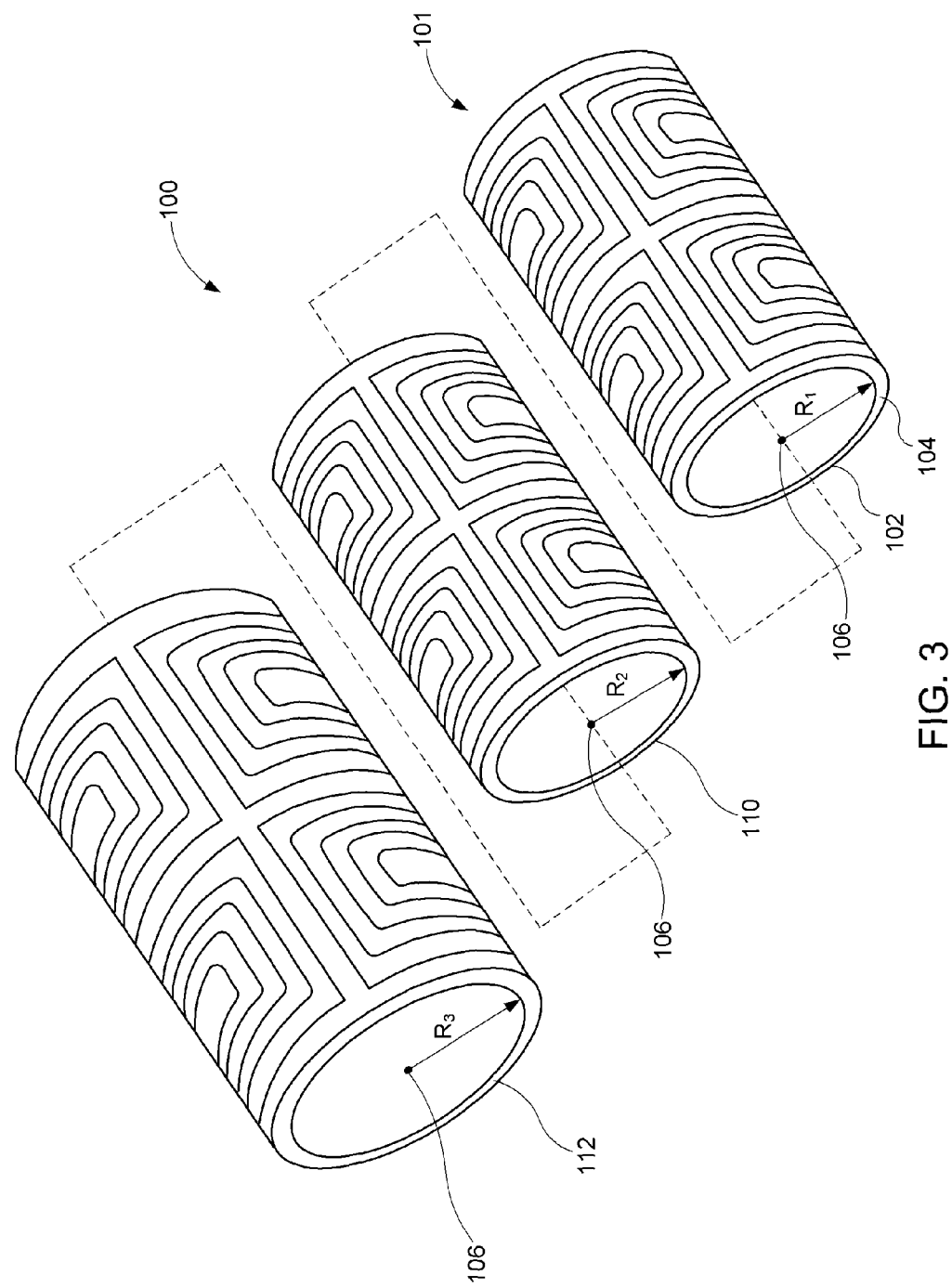
FIG. 3 is an exploded view of the coil assembly shown in FIG. 2.

FIG. 2 is a perspective view of an exemplary coil assembly 100 that may be used with the MRI system 10 shown in FIG. 1. FIG. 3 is an exploded view of the coil assembly 100 shown in FIG. 2. The coil assembly 100 includes a combined coil assembly 101 having both a primary gradient coil 102 and a corrector coil 104 that are both disposed circumferentially around a centerline axis 106 that extends through the coil assembly 100. In the exemplary embodiment, the centerline axis 106 also forms the centerline axis extending through the bore 46 of the imaging system 10 shown in FIG. 1. As shown in FIG. 2, in the exemplary embodiment, the primary gradient coil 102 is positioned co-radially with the corrector coil 104 to enable the corrector coil 104 to modify the FOV of the primary gradient coil 102 in some embodiments. Co-radial as, used herein means that both the primary gradient coil 102 and a corrector coil 104 are disposed circumferentially around the centerline axis 106. As such, both the primary gradient coil 102 and a corrector coil 104 are positioned at a radial distance $R_1$ from the centerline axis 106.

Additionally, at least a portion of the primary gradient coil 102 is interwoven with a portion of the corrector coil 104 such that a portion of the primary gradient coil 102 is concentric with a portion of the corrector coil 104 as discussed in more detail below. Interwoven as used herein means that at least one turn of either the primary gradient coil 102 or corrector coil 104 is axially located between a pair of turns forming a portion of the corrector coil 104 or the primary gradient coil 102 respectively. For example, at least one turn of the gradient coil 102 may be located axially between a pair of turns forming a portion of the corrector coil 104. Optionally, at least one turn of the corrector coil 104 may be located axially between a pair of turns forming a portion of the gradient coil 102

In one embodiment, the coil assembly 100 may also include a secondary higher order gradient coil 110 that is disposed circumferentially around the primary gradient coil 102 and the corrector coil 104. Thus, the coil 110 has a radius $R_2$ that is larger than the radius $R_1$. The coil 110 operates as a shielding coil for the corrector coil 104. In operation, the coil 110 assists in reducing and/or preventing eddy current from being induced in the superconducting magnet 12 shown in FIG. 1. The coil assembly 100 may also include a secondary gradient coil 112 that is disposed circumferentially about the coil 110. The coil 112 functions as a shielding coil for the primary gradient coil 102 and likewise operates to prevent eddy current from being induced in the superconducting magnet 12 shown in FIG. 1. Thus, as shown in FIG. 3, the coil 112 has a radius $R_3$ that is larger than the radius $R_2$ and $R_1$. Specifically, in the exemplary embodiment, $R_1<R_2<R_3$ such that both the primary gradient coil 102 and the corrector coil 104 are disposed in the interior of the coil 110. Moreover, coil 110 is disposed in the interior of the coil 112. In another embodiment, the coil 110 may be co-radial with the coil 112. More specifically, the coil 110 may be on the same radial plane as the coil 110 as discussed above.

Figure 4:
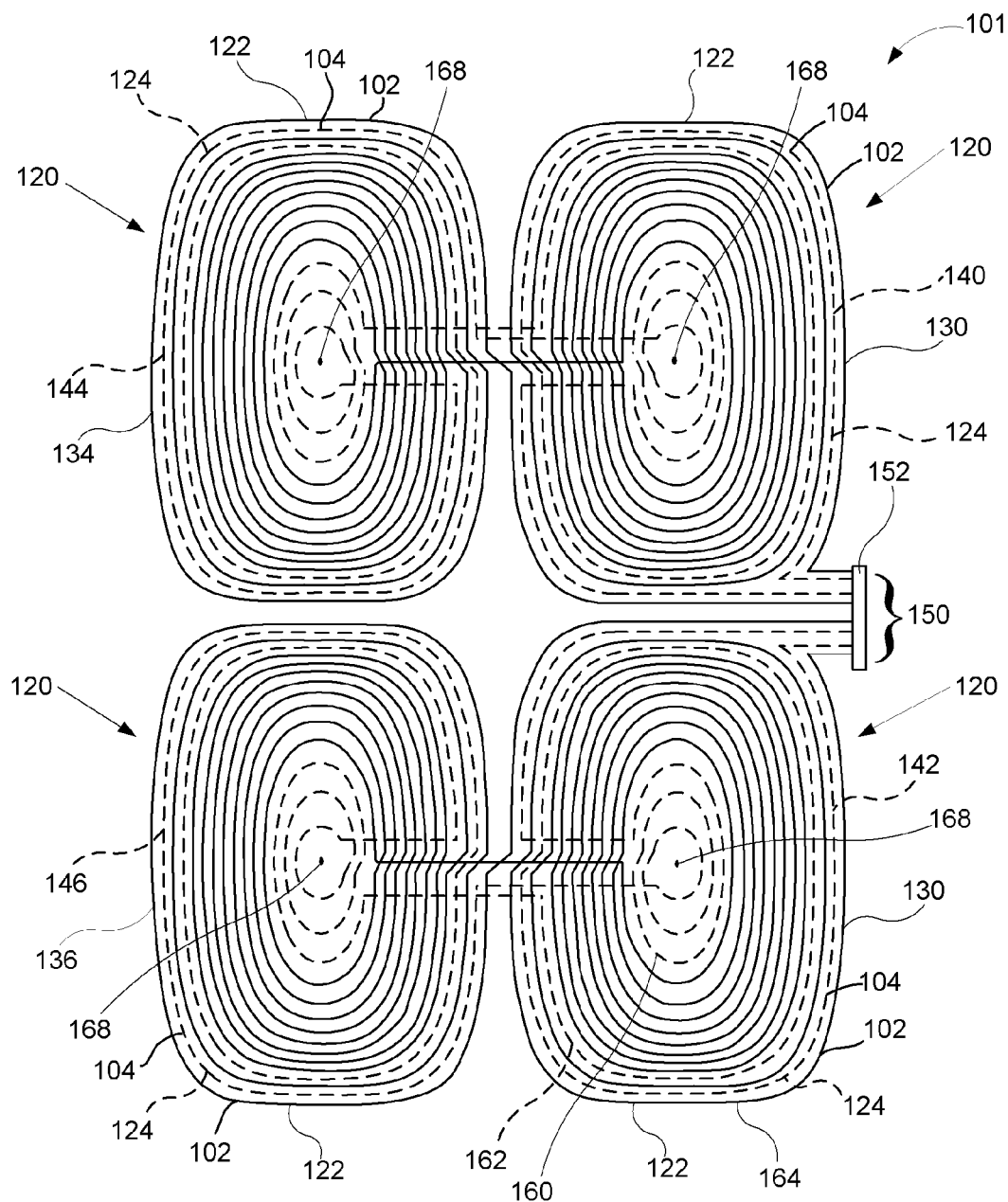
FIG. 4 is a plan view of the coil assembly shown in FIGS. 2 and 3 in accordance with various embodiments.

FIG. 4 is a plan view of the combined coil assembly 101 shown in FIGS. 2 and 3. As discussed above, the primary gradient coil 102 is disposed co-radially with the corrector coil 104. In the exemplary embodiment, the primary gradient coil 102 and the corrector coil 104 are formed as a single cylinder to reduce complexity and facilitate enhancing cooling of the coil assembly 101. Thus, the primary gradient coil 102 and the corrector coil 104 may be formed as flat copper panels or sheets that are machined to form the conductors. The sheets may be rolled into 90 degree or 180 degree sections 120, also referred to herein as fingerprints, that are assembled into the cylindrical fabrications to form the combined coil assembly 101 shown in FIGS. 2 and 3. Optionally, the sections 120 may be formed as substantially flat coils of wire, wherein each coil is rolled or formed to have a semi-cylindrical shape.

In the exemplary embodiment, shown in FIG. 4, the primary gradient coil 102 and the corrector coil 104 are formed into 180 degree sections 120, such that two sections 120 form the 360 degree cylinder shown in FIG. 3. In the exemplary embodiment, the combined coil assembly 101 includes four primary gradient coil portions 122 that form the primary gradient coil 102, and four corrector coil portions 124 that form the corrector coil 104. Each portion, 122 and/or 124 may be fabricated to include, for example, an electrical conducting layer laminated to a backing layer of insulation, which may be of a resin base formulation such as G-10 fiberglass.

As shown in FIG. 4, the primary gradient coil portions 122 are formed generally as spiral conductors, that each include a plurality of turns, a portion of which are interwoven with the respective corrector coil portion 124. Additionally, the primary gradient coil 102 is electrically coupled in series with the corrector coil 104. Additionally, the corrector coil 104 can be electrically coupled in series with the primary gradient coil 102. In the exemplary embodiment, a first primary gradient coil portion 130 is substantially symmetrical, in shape and size, with a second primary gradient coil portion 132. Moreover, a third primary gradient coil portion 134 is substantially symmetrical, in shape and size, with a fourth primary gradient coil portion 136. Additionally, a first corrector coil portion 140 is substantially symmetrical, in shape and size, with a second corrector coil portion 142. Moreover, a third corrector coil portion 144 is substantially symmetrical, in shape and size, with a fourth corrector coil portion 146.

In the exemplary embodiment, the electrical leads coupling the primary gradient coil portions 130 and 132 and the primary gradient coil portions 134 and 136 to external connections are located at the same position to enable all the external connections 150 of the coil assembly 101 to be made at substantially the same location such that the connections 150 fit flush within the coil assembly 101 and do not add to the radial or axial growth of the coil assembly 100. In the exemplary embodiment, the connections 150 are each located at a point between the sections 120, referred to herein as corner interconnects, to enable the connections 150 to be coupled to a terminal block or switch 152, etc.

As discussed above, portions of the primary gradient coil 102 are interwoven with portions of the corrector coil 104 to reduce the complexity of the coil assembly 101 and also to enable the FOV of the imaging system to be modified as is discussed in more detail below. In the exemplary embodiment, the primary gradient coil 102 is wound around a hollow conductor (not shown) during fabrication, to facilitate reducing the bend radius of the primary gradient coil 102. Moreover, the corrector coil 104 is wound such that a portion of the corrector coil 104 is disposed within the primary gradient coil 102 and a second portion of the corrector coil 104 is disposed radially outwardly from the primary gradient coil 102. Accordingly, in the exemplary embodiment, each section 120 is wound such that a portion 160 of the primary gradient coil 102 is centrally located within the section 120. A portion 162 of the corrector coil 104 is wound radially outwardly from the primary gradient coil portion 160. Moreover, a third portion 164 that includes a portion of the primary gradient coil 102 that is interwoven with a portion of the correction coil 104 is disposed radially outwardly from the second portion 162. Accordingly, the primary gradient coil 102 is concentric with the corrector coil 104 because both are wound around a common central point 168 shown in FIG. 4.

Figure 5:
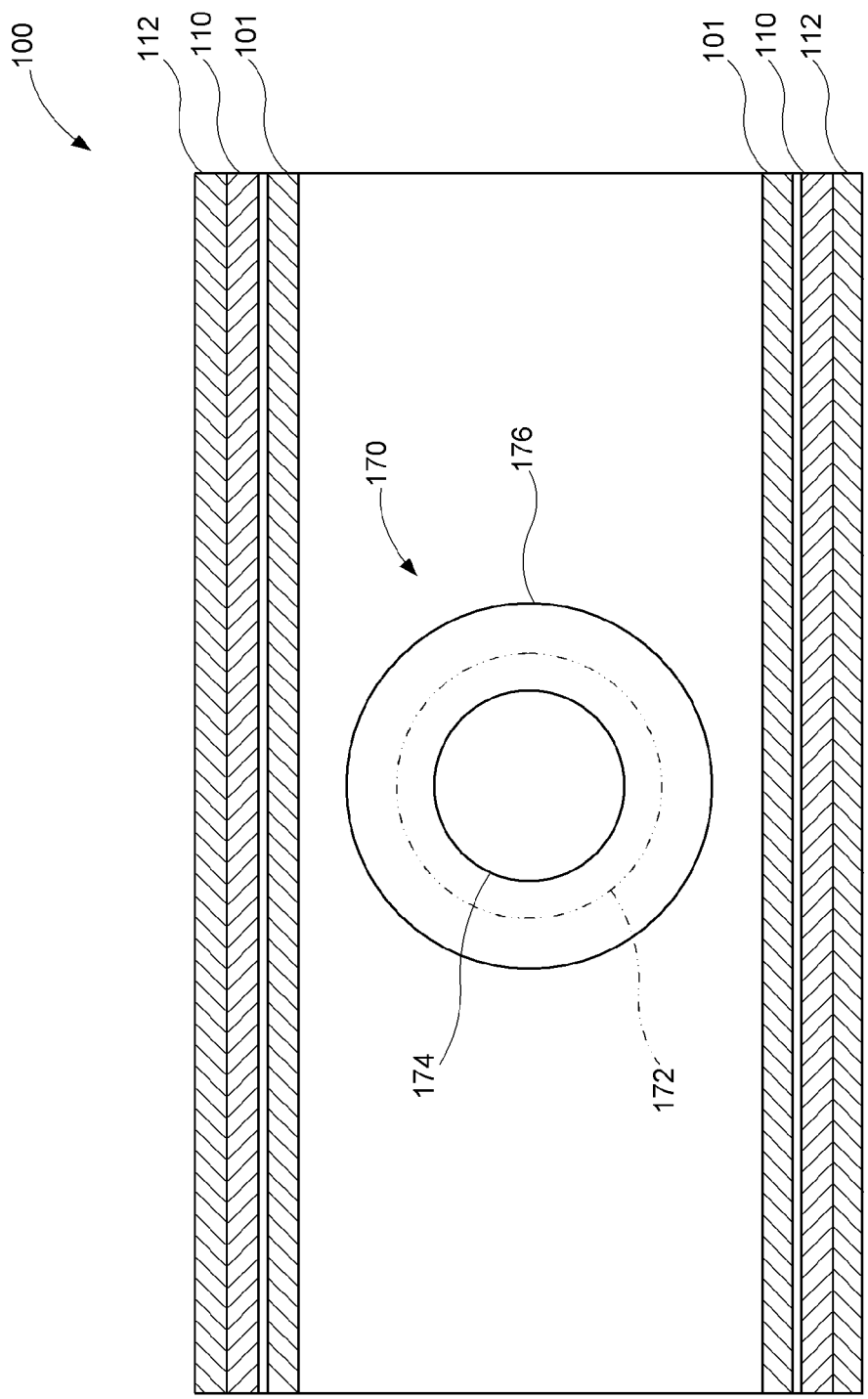
FIG. 5 is a cross-sectional view of the coil assembly shown in FIG. 2 in accordance with various embodiments.

FIG. 5 is a cross-sectional view of the coil assembly 100, shown in FIG. 2, that is used to explain the operation of the coil assembly 100. In the exemplary embodiment, the coil assembly 100 is configured to operate in a plurality of operational modes. Generally, during operation, as the strength of the primary gradient coil 102 is increased, by increasing the gain or slew rate, for example, it is desirable to reduce the FOV, to limit possible peripheral nerve stimulation. Therefore, at least some embodiments described herein enable an operator to perform whole body imaging using a larger FOV while still maintaining the maximum slew rate permissible without, causing peripheral nerve stimulation. Whereas, other embodiments described herein enable an operator to perform localized head imaging, utilizing a smaller FOV which enables the primary gradient coil 102 to be driven harder, i.e. at an increased slew rate, while still avoiding peripheral nerve stimulation.

In one mode of operation, referred to herein as cardiac mode, the corrector coil 104 is not utilized. In a second mode, referred to herein as whole body imaging, the corrector coil 104 is arranged in a first configuration to, extend the FOV of the primary gradient coil 102. In another mode of imaging, referred to herein as head imaging, the corrector coil 104 is arranged in a second configuration to reduce the size of FOV of the primary gradient coil. Thus, the combination of the primary gradient coil 102 and the corrector coil 104 may be operated in various configurations to modify the FOV and to also provide increased gain and reduced noise during operation.

Table 1, shown below, is utilized to further explain the various modes of operation.

TABLE 1

|  |  | Head Scan | Cardiac Scan | Body Scan |
| --- | --- | --- | --- | --- |
| Field-of-View (FOV) | (cm) | Small | Medium | Large |
| Maximum B | m(T) | Low | Medium | High |
| Gain/Slew Rate | T/m/s | Medium | High | Low |

For example, in the cardiac scan mode, the primary gradient coil 102 is operated alone, i.e. the corrector coil 104 is not operated, to generate a FOV 172. In the head scanning mode, the primary gradient, coil 102 is, operated in conjunction with the corrector coil 104 to generate a FOV 174 that is smaller than the FOV 172. In the head scanning mode, the corrector coil 104 is wired or configured such that current flows through the primary gradient coil 102 and the corrector coil 104 in substantially the same direction, e.g. the corrector coil 104 is wired to have a first polarity. In the whole body imaging mode, the primary gradient coil 102 is again operated in conjunction with the corrector coil 104 to generate a FOV 176 that is larger than the FOV 172. In the whole body imaging mode, the corrector coil 104 is wired or configured such that current flows through the primary gradient coil 102 in a first direction and current flows through the corrector coil 104 in an opposite second direction, e.g. the corrector coil 104 is wired to have a second polarity that is different than the first polarity.

In some embodiments, the polarity of the corrector coil 104 may be changed by operating the switch 152 shown in FIG. 4. More specifically, operating the switch 152 changes the polarity of the corrector coil 104 such that in one switch position, current flows through the corrector coil 104 in a first direction. Changing the position of the switch 152 enables current to flow through the corrector coil 104 in an opposite direction. Optionally, the terminals on the corrector coil 104 may be changed to reverse the polarity of the corrector coil 104.

Referring again to Table 1, in the cardiac scanning mode, the corrector coil 104 generates a FOV 162 (shown in FIG. 5) having a first magnetic field $B_0$, denoted as a medium magnetic field, which is achieved at a first slew rate, e.g. denoted as high. In the head scanning mode, the corrector coil 104 generates a' FOV 164 that is smaller than the FOV 162, having a second magnetic field $B_2$ which is less than $B_0$, and achieved at a second slew rate that is less than the slew rate used in the cardiac scanning mode. It should be noted that although the maximum slew rate is relatively low in this mode, the coil the could potentially be driven at higher slew rates in this mode without causing peripheral nerve stimulation. In the body scanning mode, the corrector coil 104 generates a FOV 166 that is larger than the FOV 162 and the FOV 164, having a third magnetic field $B_3$ which is less than $B_0$, and achieved at a third slew rate that is less than the slew rate used in the cardiac scanning mode and the head scanning mode.

More specifically, in the body scanning mode, a relatively large FOV is utilized compared to other imaging modes. Moreover, the magnetic field 83 is decreased which avoids the occurrence of peripheral nerve stimulation. Whereas, in the head scanning mode, where numerous slices are acquired at a relatively rapidly, the magnetic field may also changed very rapidly without causing peripheral nerve stimulation.

Accordingly, in some embodiments, the corrector coil described herein enables the slew rate, e.g. the amount of time to reach the full magnetic field strength to perform imaging, to be modified based on the operational mode discussed above. Specifically, the corrector coil described herein enables the performance characteristics of the gradient coil to be modified to modify the FOV of the gradient coil. In some embodiments, the corrector coil is arranged co-radially with the gradient coil to reduce the cost of fabrication of the coil assembly. In one mode of operation, the corrector coil extends the FOV of the imaging system. In another mode of operation, the corrector coil provides increased gain and reduced noise for applications focusing on a smaller FOV. Thus, the coil assembly described herein is suitable for both large FOV applications and focused FOV applications.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal language of the claims.

What is claimed is:

1. A coil assembly for a Magnetic Resonance Imaging (MRI) system, said coil assembly comprising:
   a primary gradient coil; and
   a corrector coil, at least a portion of the corrector coil being interwoven with a portion of the primary gradient coil wherein the portion of the primary gradient coil is concentric with the portion of the corrector coil, wherein at least one turn of at least one of the primary gradient coil or the corrector coil is axially located between a pair of turns from the other of the primary gradient coil or the corrector coil.

2. The coil assembly in accordance with claim 1 wherein the primary gradient coil is co-radial with the corrector coil.

3. The coil assembly in accordance with claim 1 wherein the primary gradient coil includes a pair of power connections and the corrector coil includes a different second pair of power connections, the primary gradient coil power connections being co-located with the corrector coil power connections.

4. The coil assembly in accordance with claim 1 wherein the coil assembly is divided into sections, each section includes a portion of the primary gradient coil, a portion of the corrector coil being wound around the portion of primary gradient coil, and an interwoven portion, the interwoven portion including a portion of the primary gradient coil and a portion of the corrector coil.

5. The coil assembly in accordance with claim 1 wherein the corrector coil generates a first Field-of-View (FOV) when subjected to a current flow in a first direction through the corrector coil, and generates a different second FOV when subjected to a current flow in an opposite second direction through the corrector coil.

6. The coil assembly in accordance with claim 1 wherein the primary gradient coil and the corrector coil are arranged in series, the corrector coil generating a larger Field-of-View (FOV) or a smaller FOV than a FOV associated with the primary gradient coil alone.

7. The coil assembly in accordance with claim 1 wherein the primary gradient coil and the corrector coil are each wound into a spiral, the corrector coil having an outer diameter that is different than an outer diameter of the primary coil.

8. The coil assembly in accordance with claim 1 wherein the coil assembly further comprises a higher order gradient coil disposed radially outwardly from the primary gradient coil and the corrector coil.

9. A Magnetic Resonance Imaging (MRI) system comprising:
   a primary gradient coil disposed within a magnet; and
   a corrector coil, at least a portion of the corrector coil being interwoven with a portion of the primary gradient coil wherein the portion of the primary gradient coil is concentric with the portion of the corrector coil, wherein at least one turn of at least one of the primary gradient coil or the corrector coil is axially located between a pair of turns from the other of the primary gradient coil or the corrector coil.

10. The MRI system of claim 9 wherein the primary gradient coil is co-radial with the corrector coil.

11. The MRI system of claim 9 wherein the primary gradient coil includes a pair of power connections and the corrector coil includes a different second pair of power connections, the primary gradient coil power connections being co-located with the corrector coil power connections.

12. The MRI system of claim 9 wherein the primary gradient coil and the corrector coil are divided into sections, each section includes a portion of the primary gradient coil, a portion of the corrector coil being wound around the portion of primary gradient coil, and an interwoven portion, the interwoven portion including a portion of the primary gradient coil and a portion of the corrector coil.

13. The MRI system of claim 9 wherein the corrector coil generates a first Field-of-View (FOV) when subjected to a current flow in a first direction through the corrector coil, and generates a second FOV when subjected to a current flow in an opposite second direction through the corrector coil.

14. The MRI system of claim 9 wherein the primary gradient coil and the corrector coil are arranged in series, the corrector coil generating a larger Field-of-View (FOV) or a smaller FOV than a FOV associated with the primary gradient coil alone.

15. The MM system of claim 9 wherein the primary gradient coil and the corrector coil are each wound into a spiral, the corrector coil having an outer diameter that is different than an outer diameter of the primary coil.

16. The MRI system of claim 9 wherein the coil assembly further comprises a higher order gradient shielding coil disposed radially outwardly from the primary gradient coil and the corrector coil.

17. A method of fabricating a coil assembly for a Magnetic Resonance Imaging (MRI) system, said method comprising:
   winding a primary gradient coil about a central axis; and
   winding a corrector coil such that at least a portion of the corrector coil is interwoven with a portion of the primary gradient coil wherein and the portion of the primary gradient coil is concentric with the portion of the corrector coil around the central axis, wherein at least one turn of at least one of the primary gradient coil or the corrector coil is axially located between a pair of turns from the other of the primary gradient coil or the corrector coil.

18. The method of claim 17 further comprising winding the primary gradient coil to be co-radial with the corrector coil.

19. The method of claim 17 wherein the primary gradient coil includes a pair of power connections and the corrector coil each includes a different second pair of power connections, the method further comprising co-locating the primary gradient coil power connections with the corrector coil power connections.

20. The method of claim 17 further comprising:
   winding a portion of the corrector coil around a portion of primary gradient coil; and
   winding an interwoven portion around the corrector coil portion, the interwoven portion including a portion of the primary gradient coil and a portion of the corrector coil.

21. A coil assembly for a Magnetic Resonance Imaging (MRI) system, said coil assembly comprising:
   a primary gradient coil; and
   a corrector coil, at least a portion of the corrector coil being interwoven with a portion of the primary gradient coil wherein the portion of the primary gradient coil is concentric with the portion of the corrector coil, wherein the primary gradient coil is co-radial with the corrector coil.

* * * * *